(12) United States Patent
Jeong et al.

(10) Patent No.: US 12,512,306 B2
(45) Date of Patent: Dec. 30, 2025

(54) LIFT PIN ASSEMBLY AND SUBSTRATE TREATING APPARATUS

(71) Applicant: SEMES CO., LTD., Chungcheongnam-do (KR)

(72) Inventors: Wan Hee Jeong, Gyeonggi-do (KR); Kuk Saeng Kim, Gyeonggi-do (KR); Jun Hyeak Choi, Seoul (KR)

(73) Assignee: SEMES CO., LTD., Chungcheongnam-do (KR)

( * ) Notice: Subject to any disclaimer, the term of this patent is extended or adjusted under 35 U.S.C. 154(b) by 462 days.

(21) Appl. No.: 18/145,145

(22) Filed: Dec. 22, 2022

(65) Prior Publication Data

US 2023/0215705 A1 Jul. 6, 2023

(30) Foreign Application Priority Data

Dec. 31, 2021 (KR) .......... 10-2021-0193596
Aug. 4, 2022 (KR) .......... 10-2022-0097529

(51) Int. Cl.
*H01J 37/32* (2006.01)
*H01L 21/683* (2006.01)
*H01L 21/687* (2006.01)

(52) U.S. Cl.
CPC .... *H01J 37/32715* (2013.01); *H01L 21/6833* (2013.01); *H01L 21/68742* (2013.01); *H01J 2237/2007* (2013.01); *H01J 2237/20235* (2013.01); *H01J 2237/334* (2013.01)

(58) Field of Classification Search
CPC .......... H01L 21/6853; H01L 21/68742; H01L 21/6831; H01L 21/67069; H01L 21/68785; H01J 37/32715; H01J 37/20; H01J 37/32009; H01J 2237/2007; H01J 2237/20235; H01J 2237/334

USPC ........................................... 118/728
See application file for complete search history.

(56) References Cited

U.S. PATENT DOCUMENTS

2007/0240646 A1* 10/2007 Jun ................ H01L 21/68742
118/729
2017/0162424 A1* 6/2017 Umise ............ H01L 21/68742

FOREIGN PATENT DOCUMENTS

| CN | 1932075 A | * | 3/2007 |
| KR | 20070084981 A | * | 8/2007 |
| KR | 10-2012-0100017 A | | 9/2012 |
| KR | 10-2019-0029365 A | | 3/2019 |
| KR | 10-2020-0134774 A | | 12/2020 |
| WO | WO-2023283587 A1 | * | 1/2023 |

OTHER PUBLICATIONS

Machine Translation CN 1032075 (Year: 2007).*
Machine Translation KR-20070084981 (Year: 2007).*
Korean Office Action issued on Mar. 11, 2024 in corresponding KR Patent Application No. 10-2022-0097529, with English translation.

* cited by examiner

*Primary Examiner* — Rodney G Mcdonald
(74) *Attorney, Agent, or Firm* — Carter, DeLuca & Farrell LLP

(57) ABSTRACT

Disclosed is a lift pin assembly, including: a lift pin inserted into a pin hole; a moving plate moving up and down by a driving unit; a bellows module including a lower flange supported by the moving plate and a bellows shaft supporting the lift pins; and a pressurizing member provided between the lower flange and the moving plate to apply constant pressure in a lifting direction of the bellows module.

20 Claims, 8 Drawing Sheets

LIFT PIN ASSEMBLY AND SUBSTRATE TREATING APPARATUS

CROSS-REFERENCE TO RELATED APPLICATIONS

This application claims priority to and the benefit of Korean Patent Application Nos. 10-2021-0193596 and 10-2022-0097529 filed in the Korean Intellectual Property Office on Dec. 31, 2021, and Aug. 4, 2022 the entire contents of which are incorporated herein by reference.

TECHNICAL FIELD

The present invention relates to a lift pin assembly and a substrate treating apparatus, and more particularly, to a lift pin assembly and a substrate treating apparatus capable of easily adjusting a height of a lift pin.

BACKGROUND ART

In order to manufacture a semiconductor device, a desired pattern is formed on a substrate through various processes, such as photography, etching, ashing, ion implantation, and thin film deposition. These processes are performed in devices, and in each device, there is provided a support unit on which a substrate is placed.

The support unit includes a support plate on which a substrate is seated, and the transfer robot transfers or receives the substrate to or from the support plate. The transfer and receiving of the substrate is performed through lift pins provided on the support plate, and the lift pins move up and down to seat or separate the substrate on or from the support plate.

In general, these lift pins raise and lower three or more lift pins by using one driving device. In this case, each lift pin may have a different height due to various causes, such as deflection and thermal deformation of the lifting plate. Therefore, when the lift pin device is set to the support unit, a process of precisely adjusting the height of the lift pins is required. In addition, the height of the lift pins changes during the process, and in this case, the height of the lift pins is adjusted while the process is stopped.

SUMMARY OF THE INVENTION

The present invention has been made in an effort to provide a lift pin assembly capable of easily adjusting the height of lift pins, and a substrate treating apparatus including the same.

The present invention has been made in an effort to provide a lift pin assembly capable of preventing a height change of lift pins due to thread tolerance between a bolt and a bellows module for height adjustment, thread wear, and random loosening, and a substrate treating apparatus including the same.

The problem to be solved by the present invention is not limited to the above-mentioned problems, and the problems not mentioned will be clearly understood by those skilled in the art from the present specification and the accompanying drawings.

An aspect of the present invention provides a substrate treating apparatus, including: a support formed in which pin holes are formed in a vertical direction; and a lift pin unit for loading and unloading a substrate onto and from the support, in which the lift pin unit includes: a lift pin provided to move up and down along the pin hole; a moving plate moving up and down by a driving unit; a bellows module including a lower flange supported by the moving plate and a bellows shaft supporting the lift pins; and a pressurizing member provided between the lower flange and the moving plate to apply constant pressure in a lifting direction of the bellows module.

Further, the pressurizing member may be provided in the form in which disc springs are stacked and disposed.

Further, the disc springs may be inserted between the lower flange and the moving plate in a constant preload state.

Further, the moving plate may have a concave groove, into which the lower flange is inserted, on an upper surface, and a height adjustment bolt which penetrates from a bottom surface of the moving plate and is coupled to the lower flange located in the concave groove may be included.

Further, the height adjustment bolt may pass through a central hole of the disc springs and be coupled to the lower flange.

Further, according to a rotation of the height adjustment bolt, a height of the lower flange may be varied in the concave groove.

Further, the number of disc springs may increase or decrease according to a height adjustment of the height adjustment bolt.

Further, the bellows shaft may include an insertion groove, into which the lift pin is inserted, at an upper end.

Another aspect of the present invention provides a lift pin unit for loading and unloading a substrate, the lift pin unit including: a lift pin inserted into a pin hole; a moving plate moving up and down by a driving unit; a bellows module including a lower flange supported by the moving plate and a bellows shaft supporting the lift pins; and a pressurizing member provided between the lower flange and the moving plate to apply constant pressure in a lifting direction of the bellows module.

Further, the pressurizing member may be provided in the form in which disc springs are stacked and disposed.

Further, the disc springs may be inserted between the lower flange and the moving plate in a constant preload state.

Further, the moving plate may have a concave groove, into which the lower flange is inserted, on an upper surface, and a height adjustment bolt which penetrates from a bottom surface of the moving plate and is coupled to the lower flange located in the concave groove may be included.

Further, the height adjustment bolt may pass through a central hole of the disc springs and be coupled to the lower flange.

Further, according to a rotation of the height adjustment bolt, a height of the lower flange may be varied in the concave groove.

Further, the number of disc springs may increase or decrease according to a height adjustment of the height adjustment bolt.

Still another aspect of the present invention provides a substrate treating apparatus, including: a process chamber for forming a process space; a gas supply unit for supplying process gas into the process chamber; a plasma generating unit for generating plasma from the process gas introduced into the process chamber; and a substrate support unit provided in the process space and supporting a substrate, in which the substrate support unit includes: a susceptor including an electrostatic electrode adsorbing a substrate with electrostatic force; and a lift pin unit for loading and unloading the substrate onto and from the support, and the lift pin unit includes: a lift pin inserted into a pin hole of the susceptor; a moving plate moving up and down by a driving unit and having a concave groove on an upper surface; a bellows module including a lower flange positioned in the concave groove and a bellows shaft supporting the lift pin; a height adjustment bolt which passes through a through hole formed on a bottom surface of the moving plate and is coupled to the lower flange located in the concave groove, and moves the bellows module in a vertical direction according to a rotation direction; and a pressing member provided between the lower flange and a bottom of the concave groove to apply constant pressure in a lifting direction of the bellows module.

Further, the pressurizing member may be provided in the form in which disc springs are stacked and disposed.

Further, the disc springs may be inserted between the lower flange and the moving plate in a constant preload state.

Further, the height adjustment bolt may pass through a central hole of the disc springs and be coupled to the lower flange.

Further, the bellows shaft may include an insertion groove, into which the lift pin is inserted, at an upper end.

According to the exemplary embodiment of the present invention, it is easy to adjust the height of the lift pins.

According to the exemplary embodiment of the present invention, it is possible to prevent a height change of the lift pins due to thread tolerance between the height adjustment bolt and the bellows module, thread abrasion, and arbitrary loosening.

According to the exemplary embodiment of the present invention, it is possible to accurately control the height adjustment of the lift pin by the height adjustment bolt.

The effect of the present invention is not limited to the foregoing effects, and the not-mentioned effects will be clearly understood by those skilled in the art from the present specification and the accompanying drawings.

DETAILED DESCRIPTION

Figure 1:
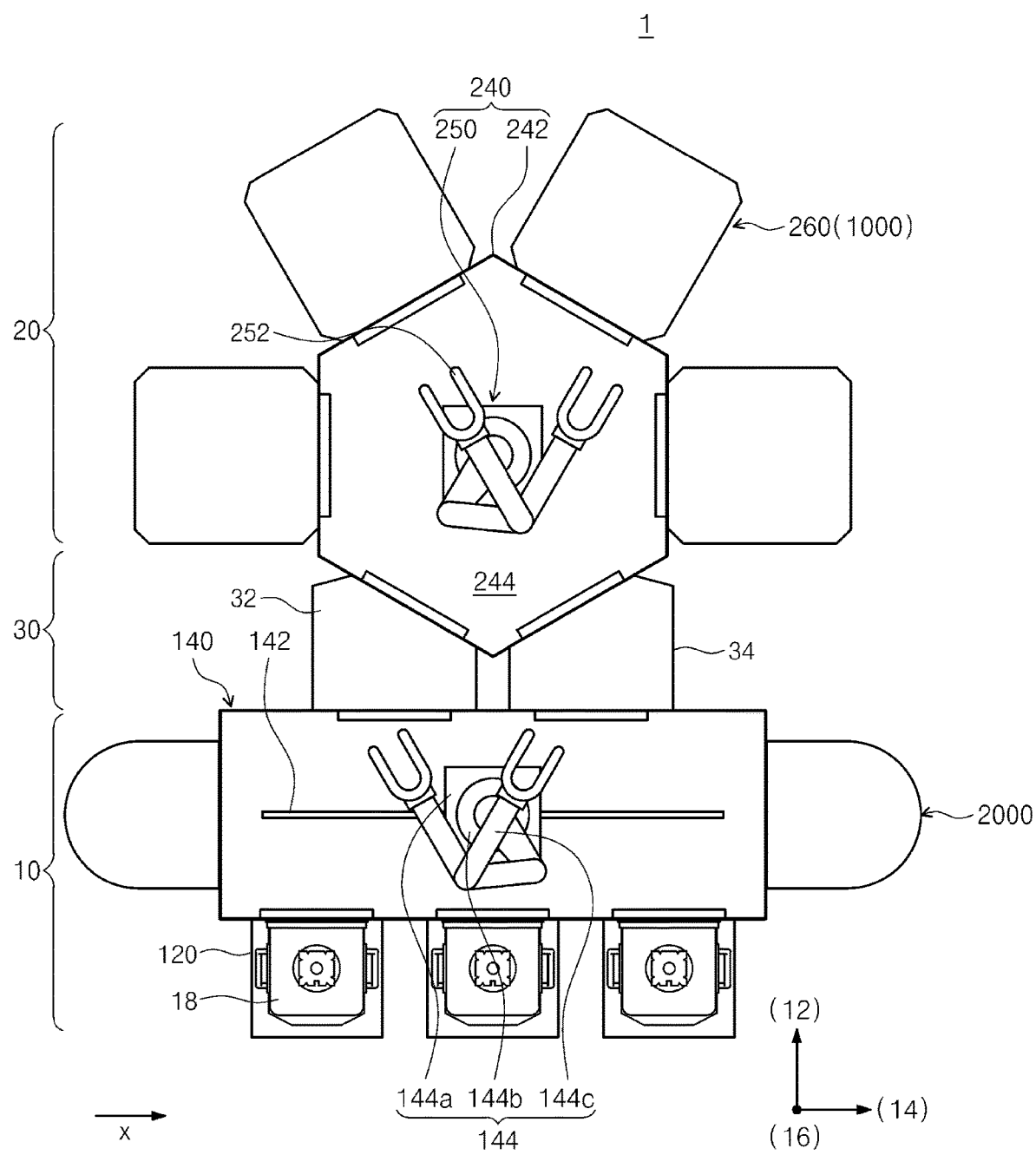
FIG. 1 is a diagram schematically illustrating a substrate treating apparatus according to an exemplary embodiment of the present invention.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations, such as "comprises" or "comprising" will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between ~" and "just between ~" or "adjacent to ~" and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

In an exemplary embodiment of the present invention, a substrate treating apparatus and method for etching a substrate W using process gas in a plasma state will be described. However, the present invention is not limited thereto, and may be applied in various ways as long as the substrate treating apparatus is the apparatus to which the lift pin assembly is applied.

FIG. 1 is a diagram schematically illustrating a substrate treating apparatus according to an exemplary embodiment of the present invention.

Referring to FIG. 1, a substrate treating apparatus 1 includes an index module 10, a loading module 30, and a process module 20.

The index module 10 may include a load port 120, a transfer frame 140, and a buffer unit 2000, and the load port 120, the transfer frame 140, and the process module 20 sequentially may be arranged in a row.

Hereinafter, a direction in which the load port 120, the transfer frame 140, the loading module 30, and the process module 20 are arranged is referred to as a first direction 12, when viewed from above, a direction perpendicular to the first direction 12 is referred to as a second direction 14, and a direction perpendicular to the plane including the first direction 12 and the second direction 14 is referred to as a third direction 16.

A carrier 18 accommodating a plurality of substrates W is seated in the load port 120. A plurality of load ports 120 is provided and is arranged in a line along the second direction 14. Slots (not illustrated) provided to support an edge of the substrate are formed in the carrier 18. A plurality of slots is provided in the third direction 16, and the substrates are positioned within the carrier so as to be stacked while being spaced apart from each other in the third direction 16. As the carrier 18, a Front Opening Unified Pod (FOUP) may be used.

The transfer frame 140 transfers the substrate W between the carrier 18 seated in the load port 120, the buffer unit 2000, and the loading module 30. An index rail 142 and an index robot 144 are provided to the transfer frame 140. A longitudinal direction of the index rail 142 is provided to be parallel to the second direction 14. The index robot 144 is installed on the index rail 142, and linearly moves in the second direction 14 along the index rail 142. The index robot 144 includes a base 144a, a body 144b, and an index arm 144c. The base 144a is installed to be movable along the index rail 142. The body 144b is coupled to the base 144a. The body 144b is provided to be movable in the third direction 16 on the base 144a.

Further, the body 144b is provided to be rotatable on the base 144a. The index arm 144c is coupled to the body 144b and is provided to be movable forwardly and backwardly with respect to the body 144b. A plurality of index arms 144c is provided to be individually driven. The index arms 144c are disposed to be stacked in the state of being spaced apart from each other in the third direction 16. A part of the index arms 144c may be used when the substrate W is transferred from the process module 20 to the carrier 18, and another part of the plurality of index arms 144c may be used when the substrate W is transferred from the carrier 18 to the process module 20. This may prevent particles generated from the substrate W before the process processing from being attached to the substrate W after the process processing in the process of loading and unloading the substrate W by the index robot 144.

The buffer unit 2000 temporarily stores the substrate W. The buffer unit 2000 performs a process of removing process by-products remaining on the substrate W. The buffer unit 2000 performs a post-treating process of post-treating the substrate W treated in the process module 20. The post-treating process may be a process of purging purge gas on the substrate W. A plurality of buffer units 2000 is provided. Each buffer unit 2000 is positioned to face each other with the transfer frame 140 interposed therebetween. The buffer units 2000 are arranged in the second direction 14. The buffer units 2000 are located on both sides of the transfer frame 140, respectively. Optionally, the buffer unit 2000 is provided singly and may be located on one side of the transfer frame 140. The loading module 30 is disposed between the transfer frame 140 and the transfer unit 240. The loading module 30 replaces the normal pressure atmosphere of the index module 10 with the vacuum atmosphere of the process module 20 for the substrate W loaded into the process module 20, or replaces the vacuum atmosphere of the process module 20 is replaced with the normal pressure atmosphere of the index module 10 for the substrate W unloaded to the index module 10. The loading module 30 provides a space where the substrate W stays between the transfer unit 240 and the transfer frame 140 before the substrate W is transferred. The loading module 30 includes a load lock chamber 32 and an unload lock chamber 34.

In the load lock chamber 32, a substrate W transferred from the index module 10 to the process module 20 is temporarily stayed. The load lock chamber 32 maintains the atmospheric pressure atmosphere in a standby state, and is blocked from the process module 20, but maintains an open state from the index module 10. When the substrate W is loaded into the load lock chamber 32, the internal space is sealed for each of the index module 10 and the process module 20. Thereafter, the internal space of the load lock chamber 32 is replaced from the normal pressure atmosphere to the vacuum atmosphere, and the road lock chamber 32 is opened to the process module 20 in a blocked state to the index module 10.

In the unload lock chamber 34, the substrate W transferred from the process module 20 to the index module 10 temporarily stays. The unload lock chamber 34 maintains a vacuum atmosphere in the standby state, and is blocked from the index module 10, but maintains an open state for the process module 20. When the substrate W is loaded into the unload lock chamber 34, the internal space is sealed for each of the index module 10 and the process module 20. Thereafter, the inner space of the unload lock chamber 34 is replaced from the vacuum atmosphere to the normal pressure atmosphere, and the unload lock chamber 34 is opened to the index module 10 while being blocked for the process module 20.

The process module 20 may include the transfer unit 240 and the plurality of process chambers.

The transfer unit 240 transfers the substrate W between the load lock chamber 32, the unload lock chamber 34, and the plurality of process chambers 260. The transfer unit 240 includes a transfer chamber 242 and a transfer robot 250. The transfer chamber 242 may be provided in a hexagonal shape. Optionally, the transfer chamber 242 may be provided in a rectangular or pentagonal shape. Around the transfer chamber 242, the load lock chamber 32, the unload lock chamber 34, and the plurality of process chambers 260 are positioned. A transfer space 244 for transferring the substrate W is provided inside the transfer chamber 242.

The transfer robot 250 transfers the substrate W in the transfer space 244. The transfer robot 250 may be located in the center of the transfer chamber 240. The transfer robot 250 may move in horizontal and vertical directions, and may have a plurality of hands 252 capable of moving forward, backward, or rotating on a horizontal plane. Each hand 252 may be driven independently, and the substrate W may be placed on the hand 252 in a horizontal state.

Hereinafter, the plasma treating apparatus 1000 provided in the process chamber 260 will be described. The plasma treating apparatus 1000 will be described as an apparatus for etching the substrate W. However, the plasma treating apparatus 1000 of the present exemplary embodiment is not limited to an etching treating apparatus and is applicable in various ways.

Figure 2:
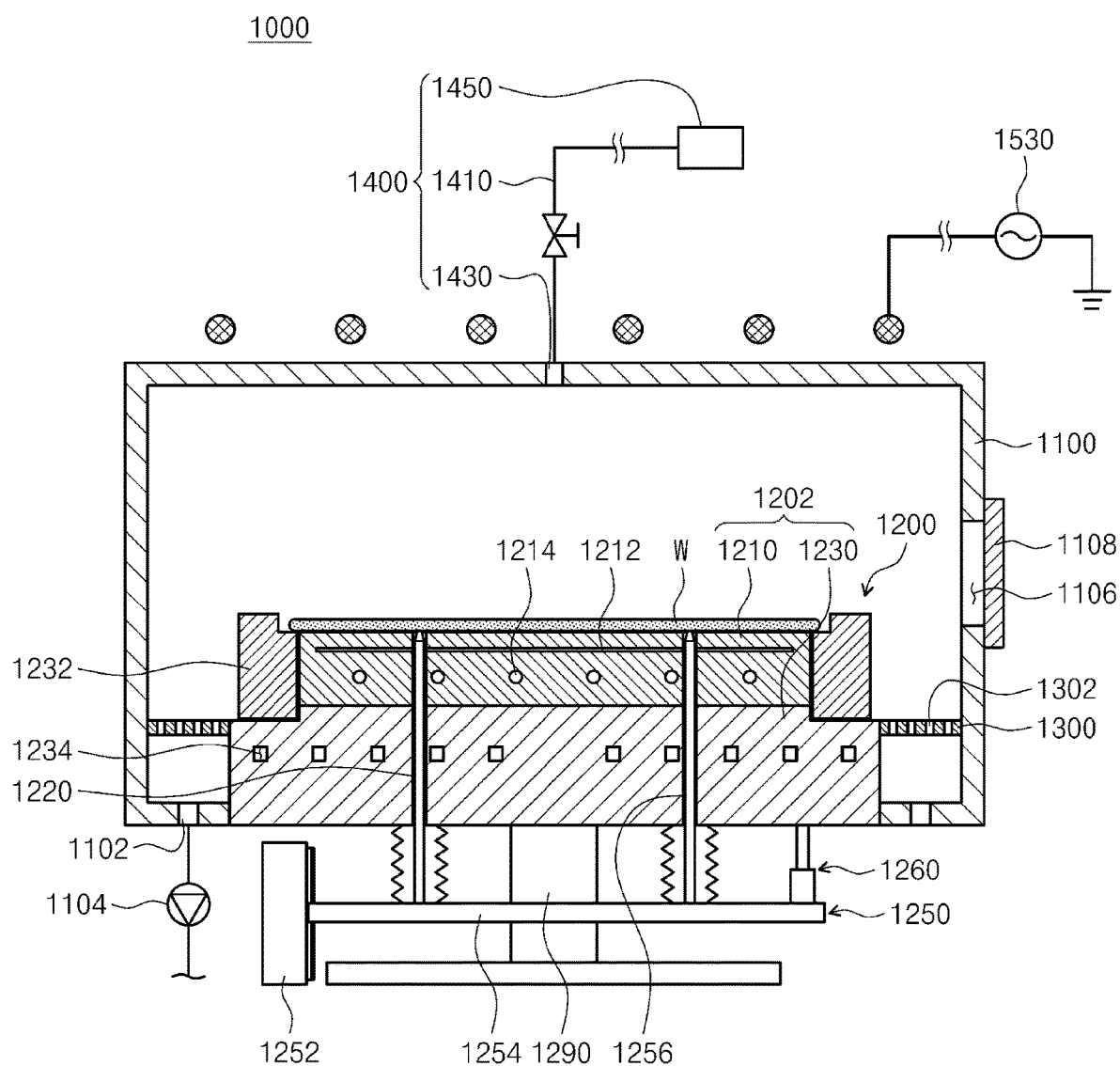
FIG. 2 is a cross-sectional view illustrating a plasma treating apparatus according to an exemplary embodiment of the present invention.

FIG. 2 is a cross-sectional view illustrating a plasma treating apparatus according to an exemplary embodiment of the present invention.

Referring to FIG. 2, a plasma treating apparatus 1000 treats a wafer W by using plasma. As an example of the substrate, a semiconductor wafer (hereinafter simply referred to as "wafer W") is provided.

The plasma treating apparatus 1000 includes a chamber 1100, a gas supply unit 1400, a plasma source 1500, and a support unit 1200.

The chamber 1100 provides a space in which a process is performed. The chamber 1100 may be made of a cylindrical metal material. An exhaust hole 1102 is formed in a bottom surface of the chamber 1100. The exhaust hole 1102 is connected to an exhaust line in which the pump 1104 is mounted. A pump 1104 provides vacuum pressure to the inside of the chamber 1100 through the exhaust line. By-products generated during the process and process gas remaining in the chamber 1100 are discharged to the outside of the chamber 1100 through the exhaust hole 1102. In addition, the pressure of the inside of the chamber 1100 is reduced to a predetermined pressure through the exhaust hole 1102.

An opening 1106 is formed in one side wall of the chamber 1100. The opening 1106 functions as a passage through which the substrate W is loaded or unloaded. The opening 1106 is opened and closed by a door 1108 provided on the outer wall of the chamber 1100.

The gas supply unit 1400 supplies process gas into the chamber 1100. The gas supply unit 1400 may include a gas storage unit 1450, a gas supply line 1410, and a gas inlet port 1430. The gas inlet port 1430 is installed on an upper wall of the chamber 1100. The gas supply line 1410 connects the gas storage unit 1450 and the gas inlet port 1430. The process gas stored in the gas storage unit 1450 is supplied to the gas inlet port 1430 through the gas supply line 1410. A valve is installed in the gas supply line 1410 to open and close the passage or to adjust the flow rate of gas flowing through the passage.

The plasma source 1500 excites the process gas supplied to the gas inlet port 1430 into a plasma state. For example, an inductively coupled plasma (ICP) source may be used as the plasma source 1500. The plasma source 1500 may include an antenna 1510 and a power source. The antenna 1510 is disposed on the outer upper portion of the chamber 1100. The antenna 1510 is provided in a spiral shape that is wound multiple times. The antenna 1510 is connected to the power source 1530 and receives high frequency power from the power source 1530. When high frequency power is applied to the antenna 1510, a discharge space forming an electric field is provided inside the chamber 1100. The electric field excites the process gas supplied to the discharge space into a plasma state.

In the present invention, as for the plasma source, a capacitively coupled plasma type, as well as an inductively coupled plasma type illustrated in the exemplary embodiment, may be applied.

The support unit 1200 supports the substrate W inside the chamber 1100. The support unit 1200 may be provided as an electrostatic chuck that adsorbs the substrate W by using electrostatic force. Optionally, the support unit 1200 may support the substrate W in various ways, such as mechanical clamping. Optionally, the substrate may be placed on the support unit without providing separate external force.

The support unit 1200 includes a susceptor 1202, a baffle 1300, a support shaft 1290 and a lift pin assembly 1250.

The susceptor 1202 may be provided in a modular form including a support 1210 and a base 1230. The support 1210 may support the substrate W. The support 1210 may be provided in a disk shape. A plurality of pin holes 1220 is formed in the support. For example, there may be three pin holes. A longitudinal direction of each pin hole 1220 may be provided in a vertical direction. Each pin hole 1220 is provided so that a length of the pin hole 1220 extends from the upper end to the lower end of the support. A pin hole is provided through the base 1230. A lower electrode 1212 may be installed inside the support 1210. The lower electrode 1212 is electrically connected to a lower power source (not illustrated) located outside the chamber 1100. The lower power source applies a current to the lower electrode 1212. When a current is applied to the lower electrode 1212, electric force is generated between the substrate W and the lower electrode 1212, and the substrate W may be adsorbed to the support 1210. A heater 1214 for heating the substrate W may be installed inside the support 1210. The heater 1214 maintains the substrate W at a process temperature during the process. The heater 1214 may be provided as a spiral coil.

The base 1230 may support the support 1210. The base 1230 is positioned under the support 1210 and is fixedly coupled with the support 1210. The upper surface of the base 1230 has a stepped shape such that the center area thereof is higher than the edge area thereof. The base 1230 has a central area of the upper surface corresponding to the bottom surface of the support 1210. Each of the pin holes 1220 of the support 1210 is formed in the base 1230 to extend in the down direction to the lower end of the base. A cooling flow path 1234 may be formed inside the base 1230. The cooling flow path 1234 is provided as a passage through which a cooling fluid circulates. The cooling fluid may maintain the substrate W at a process temperature while flowing through the cooling flow path 1234. The cooling flow path 1234 may be provided in a spiral shape inside the base 1230. Optionally, the cooling flow path 1234 may be provided on the support 1210.

The focus ring 1232 concentrates the plasma supplied into the chamber 1100 to the substrate W. The focus ring 1232 is provided in an annular ring shape. The focus ring 1232 is located on an upper edge area of the base 1230. The focus ring 1232 is provided to surround the support 1210 and the substrate W placed on the support 1210.

The baffle 1300 minimizes the flow rate of process gas exhausted to the outside of the chamber 1100. The baffle 1300 is provided between the support unit 1200 and the chamber 1100. The baffle 1300 has an annular ring shape. The baffle 1300 is formed with a plurality of through-holes 1302 penetrating in the vertical direction. Process by-products in the chamber 1100 are exhausted to the exhaust hole 1102 through the through holes 1302.

The lift pin assembly 1250 receives the substrate W from the transfer robot (not illustrated) and loads the substrate W onto the support 1210, or unloads the substrate W from the support 1210 and transfers the substrate to the transfer robot (not illustrated).

In the lift pin assembly 1250, the lift pins 1256 may be moved for each home/release/transfer position by the driving of the driving member 1252. Herein, the home position may be a position where the substrate is placed on the support 1210, the transfer position may be a position where the transfer robot transfers the substrate and the release position may be a position in which the substrate is raised so as to be spaced from the upper surface of the support 1210 by a predetermined distance before moving from the home position to the transfer position.

Figure 3:
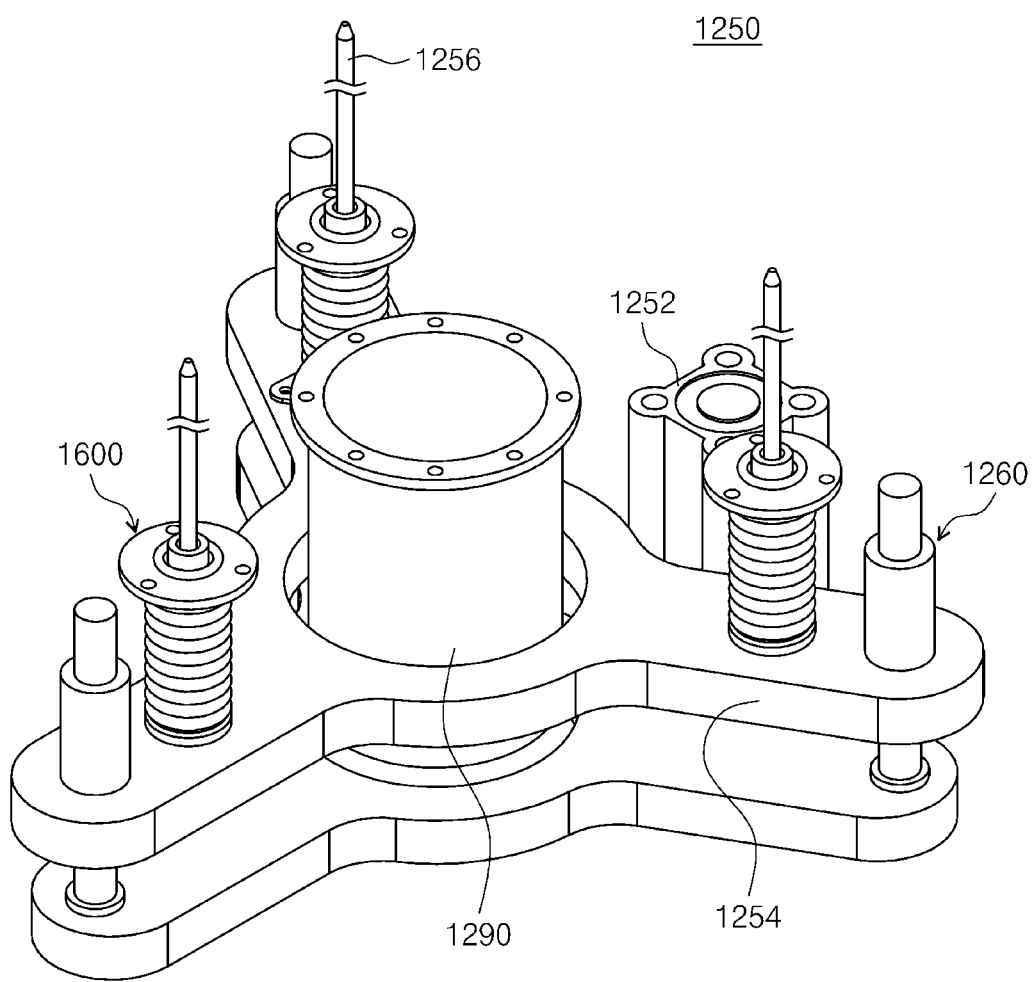
FIG. 3 is a perspective view for explaining a lift pin assembly illustrated in FIG. 2.
Figure 4:
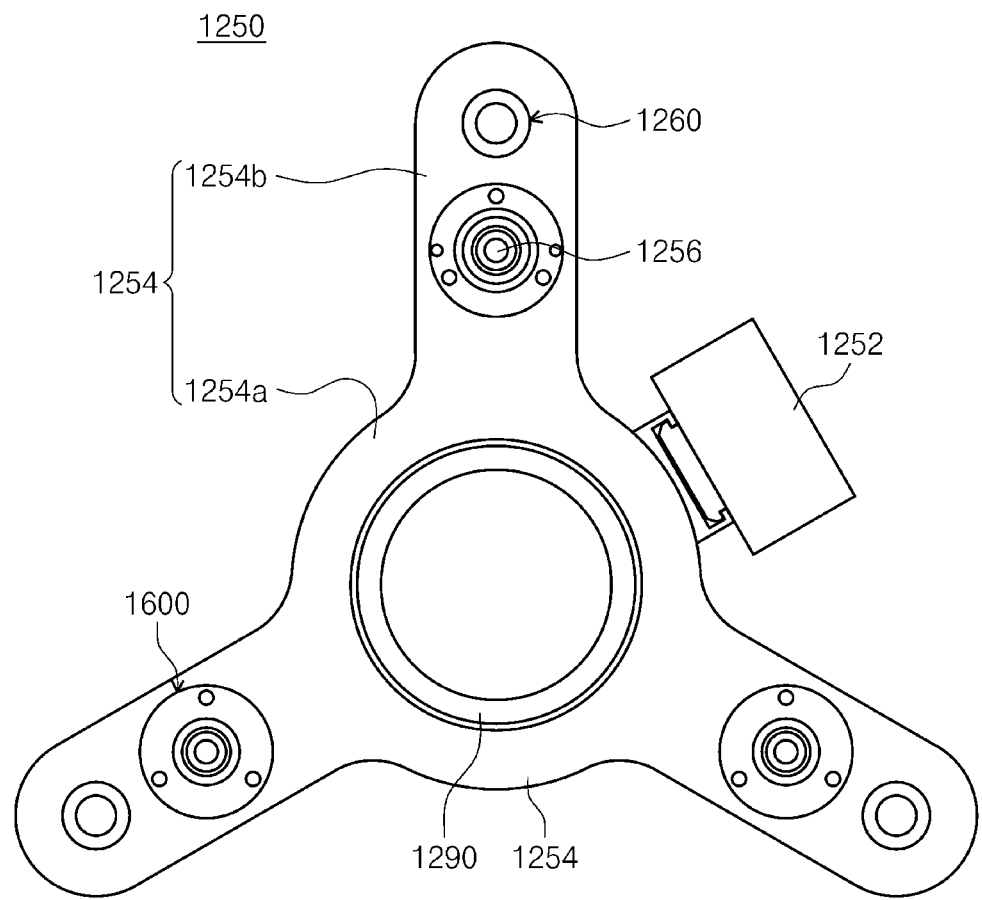
FIG. 4 is a top plan view of the lift pin assembly illustrated in FIG. 3.
Figure 5:
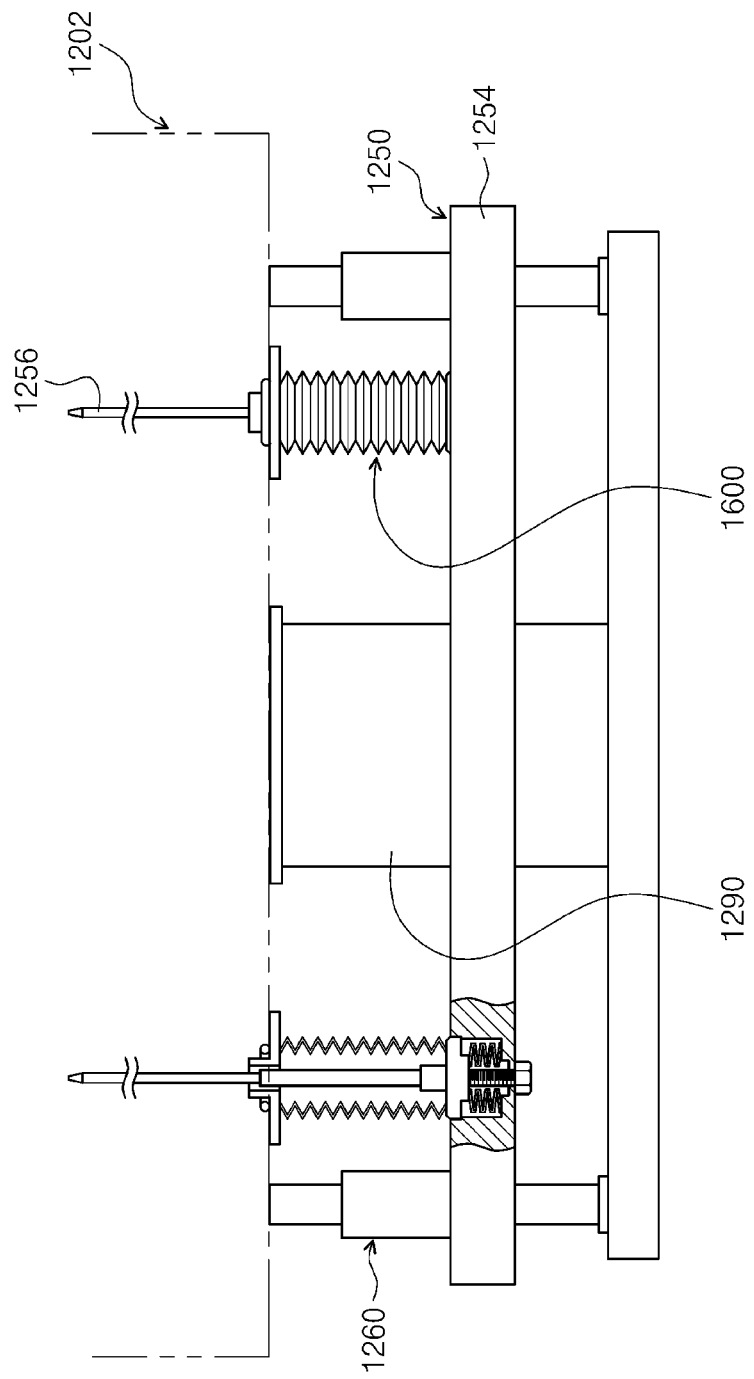
FIG. 5 is a side view of the lift pin assembly illustrated in FIG. 3.
Figure 6:
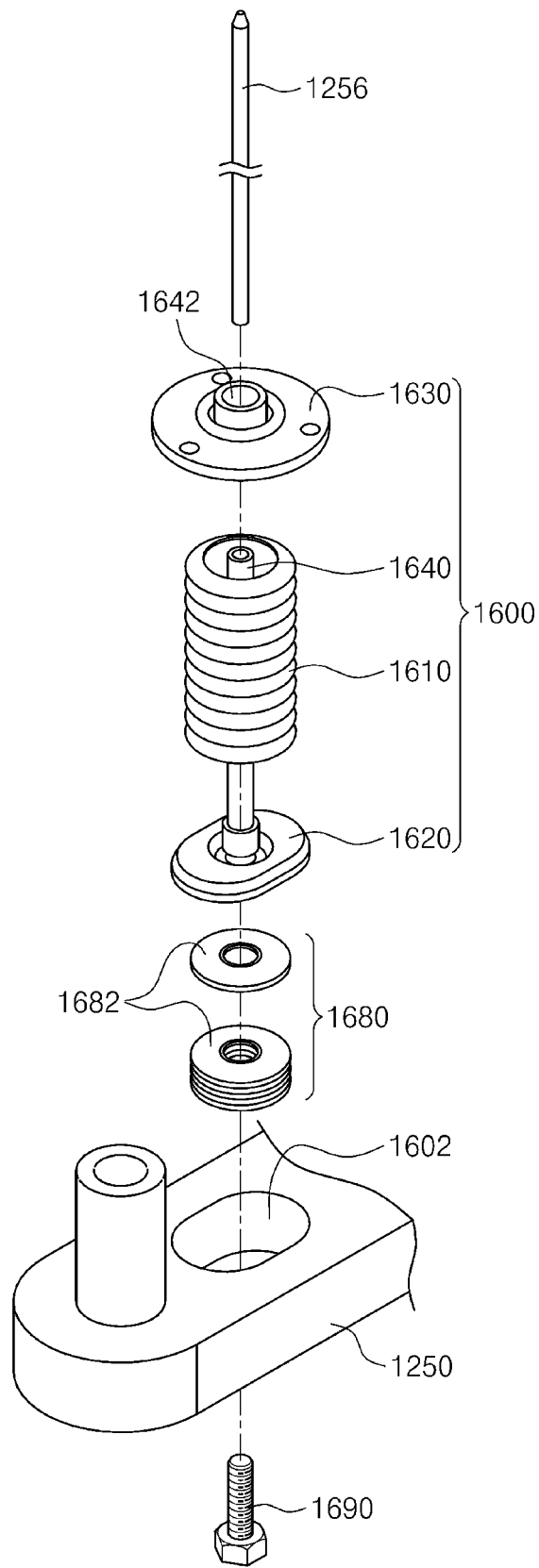
FIG. 6 is an exploded perspective view of the lift pin assembly.
Figure 7:
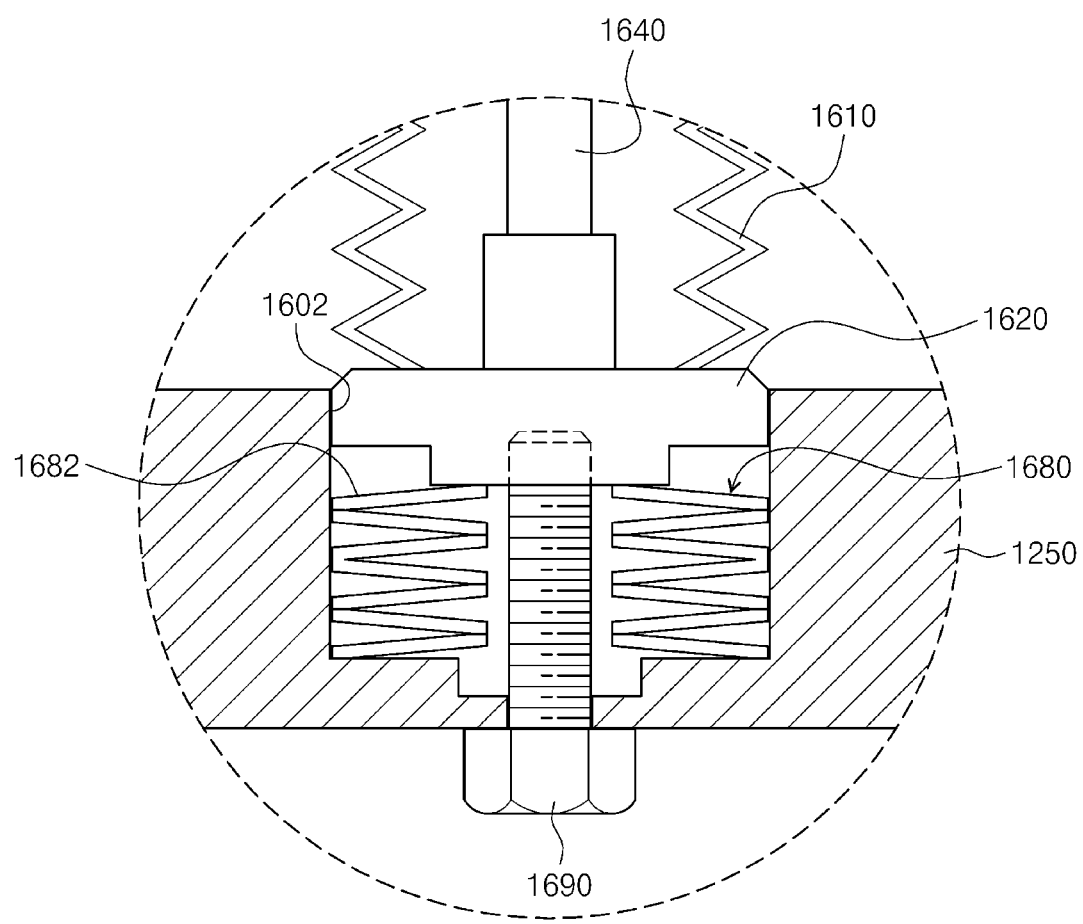
FIG. 7 is a view for explaining a pressurizing member.

FIG. 3 is a perspective view for explaining the lift pin assembly illustrated in FIG. 2, FIG. 4 is a top plan view of the lift pin assembly illustrated in FIG. 3, FIG. 5 is a side view of the lift pin assembly illustrated in FIG. 3, FIG. 6 is an exploded perspective view of the lift pin assembly, and FIG. 7 is a view for explaining a pressurizing member.

Referring to FIGS. 3 to 7, the lift pin assembly 1250 may include a driving member 1252, a moving plate 1254, lift pins 1256, a sagging prevention member 260, a bellows module 1600, a height adjustment bolt 1690, and a pressurizing member 1680.

The moving plate 1254 may be vertically moved up and down by the driving member 1252. The vertical movement of the moving plate 1254 may be guided by guide members (not illustrated) vertically installed at the edges. For example, the moving plate 1254 may be provided in the form including a central body 1254a and three lug portions 1254b (8 o'clock, 12 o'clock and 4 o'clock directions) extending from the central body 1254a at intervals of 120 degrees. However, the shape of the moving plate 1254 is not limited thereto. The lift pins 1256 may be installed in a vertical direction from each lug portion 1254b of the moving plate 1254, and may be positioned on the pin hole 1220 of the susceptor 1202. The lift pins 1256 may move vertically in the pin hole 1220 according to the vertical movement of the moving plate 1254.

The sagging prevention member 1260 may be provided between the moving plate 1254 and the susceptor 1202 to prevent the moving plate 1254 from sagging. The sagging prevention member 1260 is preferably provided on the moving plate 1254 farthest from the driving member 1252.

Since the sagging of the lift pins 1256 increases as the lift pins 1256 are further away from the driving member 1252, the sagging prevention member 1260 may be provided at a distal end of the lug portion 1254b at which the lift pin 1256 in the 4 o'clock direction, which is located directly opposite to the position at which the driving member 1252 is located, is located. The lug portion 1254b in the 4 o'clock direction may have a relatively longer length than other lug portions for installation of the sagging prevention member 1260. The sagging prevention member 1260 may prevent the lift pin 1256 from sagging by fixing the position of the lift pin 1256 for each position in the moving plate 1254.

The bellows module 1600 may include a bellows 1610, an upper flange 1630, a lower flange 1620, and a bellows shaft 1640.

The bellows 1610 has a corrugated pipe shape to easily expand and contract. The upper flange 1630 is connected to the upper end of the bellows 1610. The upper flange 1630 is fixed to the lower surface of the susceptor 1202 through which the lift pins pass. Accordingly, the upper flange 1630 fixes the bellows 1610 to the lower surface of susceptor 1202. The upper flange 1630 guides the movement of the lift pins 1256. It is possible to prevent the lift pins 1256 from shaking in the horizontal direction when the lift pins 1256 moves up and down.

The lower flange 1620 is connected to the lower end of the bellows 1610. The lower flange 1620 is located in a concave groove 1602 formed on the upper surface of the moving plate 1254. The lower flange 1620 may have a variable height on the concave groove 1602. A height adjustment bolt 1690 is fastened to the lower flange 1620. The concave groove 1602 may be provided in an elliptical shape to block any rotation of the lower flange 1620.

The bellows shaft 1640 is located within the bellows 1610. The lower end of the bellows shaft 1640 is fixed to the lower flange 1620. An insertion groove 1642 into which the lift pin 1256 is inserted is provided at an upper end of the bellows shaft 1640.

The height adjustment bolt 1690 penetrates from the bottom surface of the moving plate 1254 and is coupled to the lower flange 1620 located in the concave groove 1602. When the height adjustment bolt 1690 is tightened, the lower flange 1620 moves in the lower direction to lower the height of the lift pin, and when the height adjustment bolt 1690 is loosened, the lower flange 1620 moves in the upper direction to increase the height of the lift pin. Since the height adjustment bolt 1690 is located outside the process chamber 1100, the height of the lift pin may be adjusted without interrupting the process, and the vacuum state, which is a process environment, may be continuously maintained.

The pressurizing member 1680 is provided between the lower flange 1620 and the moving plate 1254. The pressurizing member 1680 is provided to apply a constant pressure in the lifting direction of the bellows module 1600. In the present exemplary embodiment, the pressurizing member 1680 may be provided in a form in which disc springs 1682 are stacked. The disc springs 1682 may be inserted between the lower flange 1620 and the moving plate 1254 with a constant preload state.

A constant pressure is always applied to the lower flange 1620 by the pressurizing member, and the pressurizing member may prevent the height of the lift pin from being changed due to a fine thread tolerance of the fastening of the height adjustment bolt 1690 and the lower flange 1620. In addition, the pressurizing member may prevent the fastening portion of the lower flange 1620 and the height adjustment bolt 1690 from being arbitrarily loosened during contraction and expansion of the bellows module 1600.

Meanwhile, the number of stacked disk springs 1682 may be increased or decreased according to the height adjustment of the height adjustment bolt 1690. In the present exemplary embodiment, the pressurizing member 1680 has been illustrated and described as being composed of a plurality of disc springs, but is not limited thereto, and may be replaced with springs of various shapes.

Figure 8:
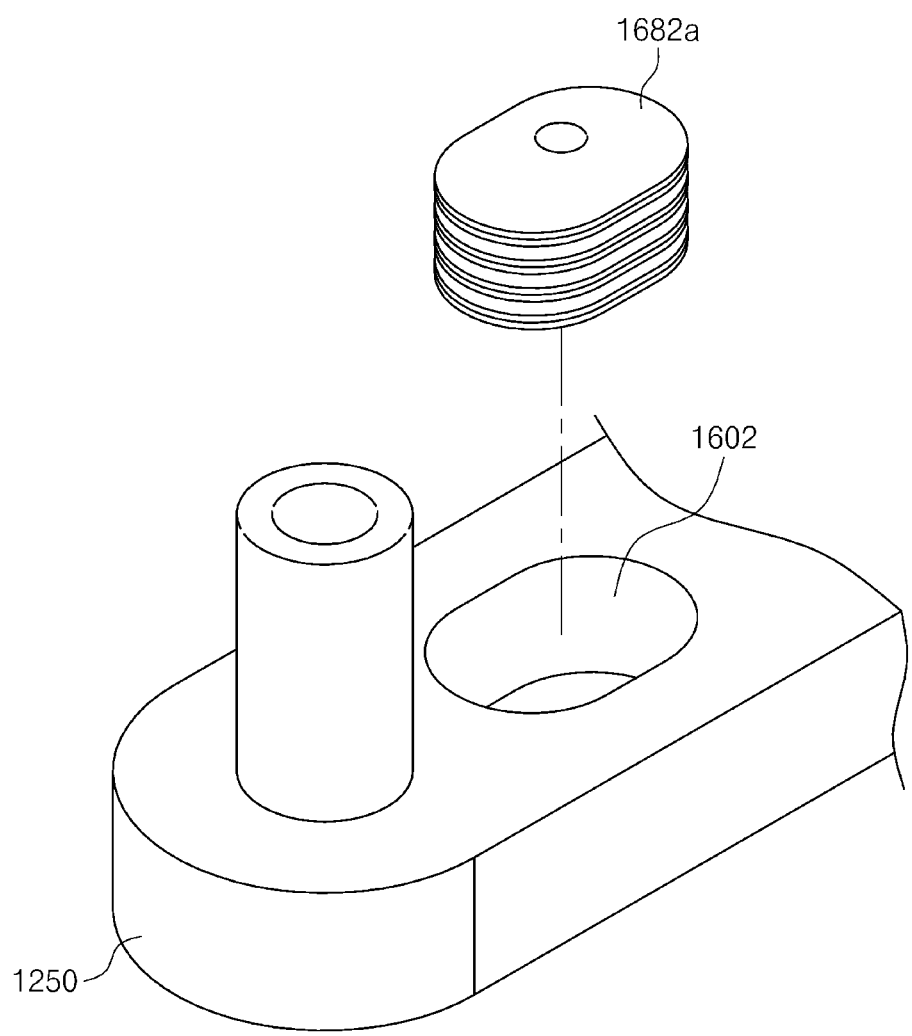
FIG. 8 is a modified example of a pressurizing member.

FIG. 8 is a modified example of a pressurizing member, and as illustrated in FIG. 7, the disc spring 1682a may be provided in a shape corresponding to a concave groove 1602.

In the lift pin assembly including the above structure, contraction force is applied to the disc spring 1682 located between the bellows module 1600 and the moving plate 1254, and the bellows module 1600 receives force in the upper direction by the repulsive force of the disc springs 1682 that do not want to contract. Accordingly, it is possible to prevent the height of the lift pin from being arbitrarily changed due to abrasion of the screw fastening portion between the height adjustment bolt 1690 and the lower flange 1620 and clearance of the screw thread (thread tolerance). As such, the pressurizing member 1680 improves the fastening force between the height adjustment bolt 1690 and the lower flange 1620 and maintains a constant distance between the height adjustment bolt 1690 and the lower flange 1620, thereby accurately providing the height adjustment distance during one rotation of the height adjustment bolt 1690.

It should be understood that the above exemplary embodiments are presented to help understanding of the present invention, do not limit the scope of the present invention, and various modified exemplary embodiments also fall within the scope of the present invention. The drawings provided in the present invention only show the optimum exemplary embodiment of the present invention. The technical scope of the present invention will be defined by the technical spirit of the accompanying claims, and it should be understood that the technical spirit of the present invention is not limited to the literal description of the claims itself, but substantially extends to the invention of an equivalent scope of the technical value.

What is claimed is:

1. A substrate treating apparatus, comprising:
   a support formed in which pin holes are formed in a vertical direction; and
   a lift pin unit for loading and unloading a substrate onto and from the support,
   wherein the lift pin unit includes:
      a lift pin provided to move up and down along the pin hole;
      a moving plate moving up and down by a driving unit;
      a bellows module including a lower flange supported by the moving plate and a bellows shaft supporting the lift pins;
      a pressurizing member provided between the lower flange and the moving plate to apply constant pressure in a lifting direction of the bellows module; and
      a sagging prevention member configured to prevent sagging of the lift pin.

2. The substrate treating apparatus of claim 1, wherein the pressurizing member is provided in the form in which disc springs are stacked and disposed.

3. The substrate treating apparatus of claim 2, wherein the disc springs are inserted between the lower flange and the moving plate in a constant preload state.

4. The substrate treating apparatus of claim 2, wherein the moving plate has a concave groove, into which the lower flange is inserted, on an upper surface, and
   a height adjustment bolt which penetrates from a bottom surface of the moving plate and is coupled to the lower flange located in the concave groove is included.

5. The substrate treating apparatus of claim 4, wherein the height adjustment bolt passes through a central hole of the disc springs and is coupled to the lower flange.

6. The substrate treating apparatus of claim 4, wherein according to a rotation of the height adjustment bolt, a height of the lower flange is varied in the concave groove.

7. The substrate treating apparatus of claim 4, wherein the number of disc springs increases or decreases according to a height adjustment of the height adjustment bolt.

8. The substrate treating apparatus of claim 1, wherein the bellows shaft includes an insertion groove, into which the lift pin is inserted, at an upper end.

9. A lift pin unit for loading and unloading a substrate, the lift pin unit comprising:
   a lift pin inserted into a pin hole;
   a moving plate moving up and down by a driving unit;
   a bellows module including a lower flange supported by the moving plate and a bellows shaft supporting the lift pins;
   a pressurizing member provided between the lower flange and the moving plate to apply constant pressure in a lifting direction of the bellows module; and
   a sagging prevention member configured to prevent sagging of the lift pin.

10. The lift pin unit of claim 9, wherein the pressurizing member is provided in the form in which disc springs are stacked and disposed.

11. The lift pin unit of claim 10, wherein the disc springs are inserted between the lower flange and the moving plate in a constant preload state.

12. The lift pin unit of claim 10, wherein the moving plate has a concave groove, into which the lower flange is inserted, on an upper surface, and
    a height adjustment bolt which penetrates from a bottom surface of the moving plate and is coupled to the lower flange located in the concave groove is included.

13. The lift pin unit of claim 12, wherein the height adjustment bolt passes through a central hole of the disc springs and is coupled to the lower flange.

14. The lift pin unit of claim 12, wherein according to a rotation of the height adjustment bolt, a height of the lower flange is varied on the concave groove.

15. The lift pin unit of claim 12, wherein the number of disc springs increases or decreases according to a height adjustment of the height adjustment bolt.

16. A substrate treating apparatus, comprising:
    a process chamber for forming a process space;
    a gas supply unit for supplying process gas into the process chamber;
    a plasma generating unit for generating plasma from the process gas introduced into the process chamber; and
    a substrate support unit provided in the process space and supporting a substrate,
    wherein the substrate support unit includes:
       a susceptor including an electrostatic electrode adsorbing a substrate with electrostatic force; and
       a lift pin unit for loading and unloading the substrate onto and from the substrate support, and
       the lift pin unit includes:
          a lift pin inserted into a pin hole of the susceptor;
          a moving plate moving up and down by a driving unit and having a concave groove on an upper surface;
          a bellows module including a lower flange positioned in the concave groove and a bellows shaft supporting the lift pin;
          a height adjustment bolt which passes through a through hole formed on a bottom surface of the moving plate and is coupled to the lower flange located in the concave groove, and moves the bellows module in a vertical direction according to a rotation direction;
          a pressurizing member provided between the lower flange and a bottom of the concave groove to apply constant pressure in a lifting direction of the bellows module; and
          a sagging prevention member configured to prevent sagging of the lift pin.

17. The substrate treating apparatus of claim 16, wherein the pressurizing member is provided in the form in which disc springs are stacked and disposed.

18. The substrate treating apparatus of claim 17, wherein the disc springs are inserted between the lower flange and the moving plate in a constant preload state.

19. The substrate treating apparatus of claim 16, wherein the height adjustment bolt passes through a central hole of the disc springs and is coupled to the lower flange.

20. The substrate treating apparatus of claim 16, wherein the bellows shaft includes an insertion groove, into which the lift pin is inserted, at an upper end.

* * * * *